United States Patent
Li

(10) Patent No.: US 10,580,509 B2
(45) Date of Patent: Mar. 3, 2020

(54) ARRAY SUBSTRATE, DISPLAY PANEL AND DISPLAY DEVICE

(71) Applicant: Shenzhen China Star Optoelectronics Semiconductor Display Technology Co., Ltd., Shenzhen, Guangdong (CN)

(72) Inventor: Wenying Li, Guangdong (CN)

(73) Assignee: Shenzhen China Star Optoelectronics Semiconductor Display Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 15/739,747

(22) PCT Filed: Oct. 20, 2017

(86) PCT No.: PCT/CN2017/106962
§ 371 (c)(1),
(2) Date: Dec. 24, 2017

(87) PCT Pub. No.: WO2019/061591
PCT Pub. Date: Apr. 4, 2019

(65) Prior Publication Data
US 2019/0096499 A1    Mar. 28, 2019

(30) Foreign Application Priority Data

Sep. 26, 2017  (CN) .......................... 2017 1 0887059

(51) Int. Cl.
*G09G 3/36*  (2006.01)
*G11C 19/28*  (2006.01)
(Continued)

(52) U.S. Cl.
CPC .......... *G11C 19/287* (2013.01); *G02F 1/1368* (2013.01); *G02F 1/13454* (2013.01);
(Continued)

(58) Field of Classification Search
CPC .......... G11C 19/28; G09G 3/32; G09G 3/342; G09G 3/36
See application file for complete search history.

(56) References Cited

U.S. PATENT DOCUMENTS 8,049,703 B2   11/2011  Chang
9,818,353 B2 * 11/2017  So ............................ G09G 3/20
(Continued)

FOREIGN PATENT DOCUMENTS

CN   101191920 A   6/2008
CN   102881248 A   1/2013
(Continued)

*Primary Examiner* — Olga V Merkoulova
(74) *Attorney, Agent, or Firm* — Andrew C. Cheng

(57) ABSTRACT

Array substrate, display panel and display device are provided. The array substrate includes multiple scanning lines, multiple data lines, multiple shift registers and multiple switching units. Each shift register is used for inputting a scanning signal to one terminal of a corresponding scanning line, the other terminal of each scanning line is connected with a first terminal of the switching unit, a second terminal of the switching unit receives a first reference voltage, a control terminal of the switching unit receives a first control signal. The shift register and the switching unit simultaneously pull down a voltage level of the scanning line to a low level. The present invention can realize a narrow frame, increase the user experience and ensure that the time that the voltage level of the scanning line pulled to the low level is the same.

17 Claims, 4 Drawing Sheets

(51) Int. Cl.
  *G02F 1/1345* (2006.01)
  *G02F 1/1335* (2006.01)
  *G02F 1/1368* (2006.01)
  *H01L 27/12* (2006.01)

(52) U.S. Cl.
  CPC ..... *G02F 1/133514* (2013.01); *G09G 3/3677* (2013.01); *H01L 27/124* (2013.01); *G09G 2300/0408* (2013.01); *G09G 2310/0286* (2013.01); *G09G 2310/08* (2013.01)

(56) References Cited

U.S. PATENT DOCUMENTS

| | | | |
|---|---|---|---|
| 2006/0007085 A1* | 1/2006 | Kim | G09G 3/3677 345/87 |
| 2008/0002803 A1* | 1/2008 | Kim | G09G 3/006 377/64 |
| 2009/0051639 A1 | 2/2009 | Liu | |
| 2010/0007598 A1 | 1/2010 | Chan et al. | |
| 2013/0147773 A1 | 6/2013 | Jin | |
| 2015/0340102 A1* | 11/2015 | Qian | G11C 19/184 377/54 |
| 2015/0371598 A1* | 12/2015 | So | G09G 3/20 345/212 |
| 2016/0180964 A1 | 6/2016 | Hu | |
| 2019/0043412 A1* | 2/2019 | Yang | G09G 3/2092 |

FOREIGN PATENT DOCUMENTS

| | | |
|---|---|---|
| CN | 103280201 A | 9/2013 |
| CN | 104252079 A | 12/2014 |
| CN | 106486048 A | 3/2017 |

\* cited by examiner

ARRAY SUBSTRATE, DISPLAY PANEL AND DISPLAY DEVICE

BACKGROUND OF THE INVENTION

1. Field of the Invention

The present invention relates to a display technology field, and more particularly to an array substrate, a display panel and a display device.

2. Description of Related Art

A liquid crystal display device has features of high display quality, low cost and easy to carry so that the liquid crystal display device is applied in a display terminal such as a mobile communication equipment, a personal computer (PC) and a television (TV). The panel driving technology of TV liquid crystal display device currently adopted gradually tends to GOA (Gate Driver on Array) technology. The GOA technology adopts original manufacturing process of a flat display panel to manufacture the driving circuit of horizontal scan lines to a periphery of the display region. The GOA technology can simplify the manufacturing process of the flat display panel to omit the bonding process at the direction of the horizontal scan lines so as to increase the production capacity and decrease the production cost.

As shown in FIG. 1, multiple shift registers 10 of the conventional liquid crystal display device are used for providing scanning signals to multiple scanning lines Gn to the array substrate, which includes multiple first shift registers 11 and multiple second shift registers 12. The multiple first shift registers 11 are disposed at a left side of the display region AA of the array substrate, and are respectively connected with terminals of the multiple scanning lines Gn. The multiple second shift registers 12 are disposed at a right side of the display region AA of the array substrate, and are respectively connected with the other terminals of the multiple scanning lines Gn.

Wherein, a first stage of the first shift registers 11 and a first stage of the second shift registers 12 are all connected with a starting signal STV. The multiple first shift registers 11 and the multiple second shift registers 12 are respectively connected with one high frequency clock signal in a first low frequency clock signal LC1, a second low frequency clock signal LC2, a direct-current low voltage VSS and high clock signals CK1-CK4. At two sides of the display region AA, four signal lines are required to transmit one high frequency clock signal in the first low frequency clock signal LC1, the second low frequency clock signal LC2, the direct-current low voltage VSS and the high clock signals CK1-CK4. Accordingly, a space occupied by the multiple shift registers 10 is large, which is unable to achieve a narrow-frame design.

SUMMARY OF THE INVENTION

The technology problem mainly solved by the present invention is to provide an array substrate, a display panel and a display device, which can reduce the space occupied by the shift registers, realize a narrow frame and increase the user experience.

In order to solve the above technology problem, a technology solution adopted by the present invention is: providing a display panel, wherein the display panel includes an array substrate, and the array substrate comprises multiple scanning lines, multiple data lines, multiple shift registers and multiple switching units; wherein the multiple scanning lines and the multiple data lines are intersected in order to form multiple pixel units; wherein each shift register is used for inputting a scanning signal to one terminal of a corresponding scanning line, the other terminal of each scanning line is connected with a first terminal of the switching unit, a second terminal of the switching unit receives a first reference voltage, a control terminal of the switching unit receives a first control signal; and wherein the shift register and the switching unit simultaneously pull down a voltage level of the scanning line to a low level; wherein the multiple shift registers includes multiple odd-numbered stage of the shift registers and multiple even-numbered stage of the shift registers, the multiple odd-numbered stage of the shift registers are disposed at a left side of a display region of the array substrate, the multiple even-numbered stage of the shift registers are disposed at a right side of the display region of the array substrate, the multiple odd-numbered stage of the shift registers are respectively connected with terminals of odd-numbered stage of the scanning lines, and the multiple even-numbered stage of the shift registers are respectively connected with terminals of even-numbered stage of the scanning lines; wherein the multiple switching units include multiple first switching units and multiple second switching units, the multiple first switching units are disposed at the right side of the display region, and the multiple second switching units are disposed at the left side of the display region; wherein the multiple first switching units are respectively connected with the other terminals of the odd-numbered stage of the scanning lines, and the multiple second switching units are respectively connected with the other terminals of the even-numbered stage of the scanning lines; and wherein the multiple shift registers are disposed at the left side of the display region of the array substrate, the multiple switching units are disposed at the right side of the display region.

In order to solve the above technology problem, another technology solution adopted by the present invention is: providing an array substrate, comprising: multiple scanning lines; multiple data lines; multiple shift registers; and multiple switching units; wherein the multiple scanning lines and the multiple data lines are intersected in order to form multiple pixel units; wherein each shift register is used for inputting a scanning signal to one terminal of a corresponding scanning line, the other terminal of each scanning line is connected with a first terminal of the switching unit, a second terminal of the switching unit receives a first reference voltage, a control terminal of the switching unit receives a first control signal; and wherein the shift register and the switching unit simultaneously pull down a voltage level of the scanning line to a low level.

In order to solve the above technology problem, another technology solution adopted by the present invention is: providing a display device, wherein the display device includes an array substrate, and the array substrate comprises: multiple scanning lines; multiple data lines; multiple shift registers; and multiple switching units; wherein the multiple scanning lines and the multiple data lines are intersected in order to form multiple pixel units; wherein each shift register is used for inputting a scanning signal to one terminal of a corresponding scanning line, the other terminal of each scanning line is connected with a first terminal of the switching unit, a second terminal of the switching unit receives a first reference voltage, a control terminal of the switching unit receives a first control signal;

and wherein the shift register and the switching unit simultaneously pull down a voltage level of the scanning line to a low level.

The beneficial effect of the present invention is: comparing to the conventional art, each shift register of the present invention is used for inputting a scanning signal to one terminal of a corresponding scanning line, the other terminal of each scanning line is connected with a first terminal of the switching unit, a second terminal of the switching unit receives a first reference voltage, a control terminal of the switching unit receives a first control signal and the shift register and the switching unit simultaneously pull down a voltage level of the scanning line to a low level. Wherein, each scanning line is corresponding to one shift register so as to reduce the space occupied by the multiple shift registers in order to realize a narrow frame design and increase the user experience. Besides, the shift register and the switching unit simultaneously pull down a voltage level of the scanning line to a low level, which can ensure that the time that the voltage level of the scanning line pulled to the low level is the same.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 2:
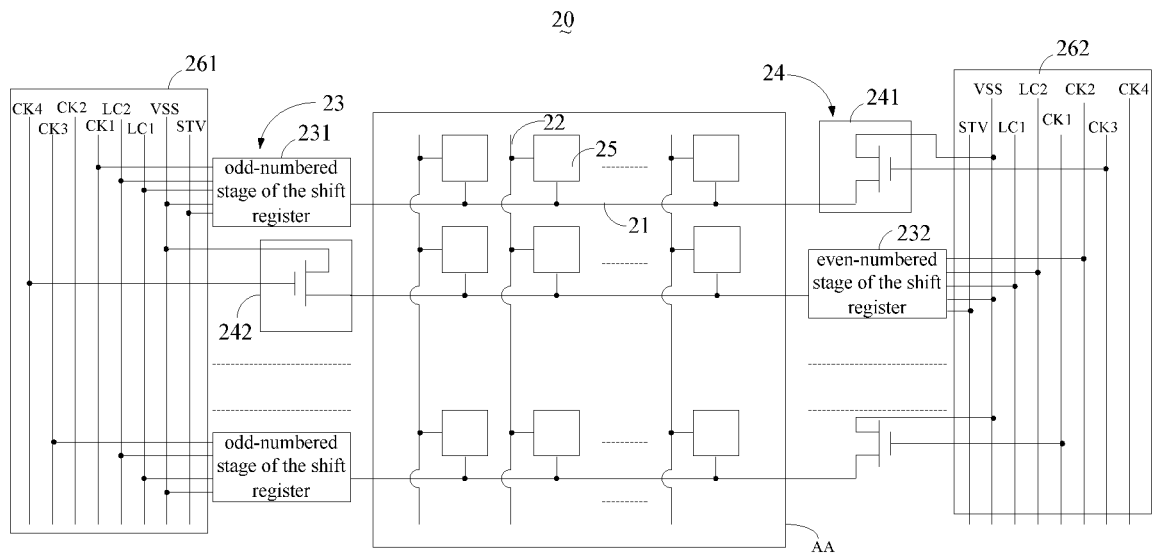
FIG. 2 is a schematic diagram of an array substrate according to a first embodiment.

With reference to FIG. 2, FIG. 2 is a schematic diagram of an array substrate according to a first embodiment. An array substrate 20 of the present embodiment includes multiple scanning lines 21, multiple data lines 22, multiple shift registers 23 and multiple switching units 24. Wherein, each of the number of the multiple shift registers 23 and the number of the switching units 24 is corresponding to the number of the multiple scanning lines 21. For example, the array substrate 20 includes 1080 scanning lines 21, and correspondingly, 1080 shift registers 23 and 1080 switching units 24 are provided.

Wherein, the multiple scanning lines 21 and the multiple data lines 22 are intersected in order to form multiple pixel units 25. Each shift register 23 is connected with one terminal of a corresponding scanning line 21 for inputting a scanning signal to the scanning line 21. When the scanning line 21 is inputted with a scanning signal, a pixel unit 25 connected with the scanning line 21 obtains a data signal. The other terminal of the scanning line 21 is connected with a first terminal of the switching unit 24. A second terminal of the switching unit 24 receives a first reference voltage VSS (that is, a direct-current low voltage VSS illustrated below). A control terminal of the switching unit 24 receives a first control signal. When the shift register 23 and the corresponding switching unit 24 are operated simultaneously, the shift register 23 and the switching unit 24 simultaneously pull down a voltage level of the scanning line 21 to a low level such that the pixel units 25 connected at two sides of the scanning line 21 are simultaneously turned off.

The multiple shift registers 23 of the present embodiment includes multiple odd-numbered stage of the shift registers 231 and multiple even-numbered stage of the shift registers 232. The multiple odd-numbered stage of the shift registers 231 are disposed at a left side of the display region AA of the array substrate 20. The multiple even-numbered stage of the shift registers 232 are disposed at a right side of the display region AA of the array substrate 20. The multiple odd-numbered stage of the shift registers 231 are respectively connected with terminals of odd-numbered stage of the scanning lines 21, and the multiple even-numbered stage of the shift registers 232 are respectively connected with terminals of even-numbered stage of the scanning lines 21.

Wherein, the multiple switching units 24 include multiple first switching units 241 and multiple second switching units 242. The multiple first switching units 241 are disposed at the right side of the display region AA, and the multiple second switching units 242 are disposed at the left side of the display region AA. Wherein, the multiple first switching units 241 are respectively connected with the other terminals of the odd-numbered stage of the scanning lines 21, and the multiple second switching units 242 are respectively connected with the other terminals of the even-numbered stage of the scanning lines 21.

A side of the multiple odd-numbered stage of the shift registers 231 away from the display region AA is provided with signal lines 261. The signal lines 261 are used for transmitting a starting signal STV, a first low frequency clock signal LC1, a second low frequency clock signal LC2, a direct-current low voltage VSS and one high frequency clock signal in the high frequency clock signals CK1-CK4. The multiple odd-numbered stage of the shift registers 231 are connected with the signal lines 261. For example, the first odd-numbered stage of the shift registers 231 receives the starting signal STV, the first low frequency clock signal LC1, a second low frequency clock signal LC2, a direct-current low voltage VSS and a high frequency clock signal CK1 through the signal line 261. The n-th odd-numbered stage of the shift registers 231 receives the starting signal STV, the first low frequency clock signal LC1, a second low frequency clock signal LC2, a direct-current low voltage VSS and one high frequency clock signal in high frequency clock signals CK1-CK4 through the signal line 261, wherein, n is greater than 1.

A side of the multiple even-numbered stage of the shift registers 232 away from the display region AA is provided with signal lines 262. The signal lines 262 are used for transmitting a starting signal STV, a first low frequency clock signal LC1, a second low frequency clock signal LC2, a direct-current low voltage VSS and one high frequency clock signal in the high frequency clock signals CK1-CK4.

The multiple even-numbered stage of the shift registers 232 are connected with the signal lines 262. For example, the first even-numbered stage of the shift registers 232 receives the starting signal STV, the first low frequency clock signal LC1, a second low frequency clock signal LC2, a direct-current low voltage VSS and a high frequency clock signal CK2 through the signal lines 221. The n-th even-numbered stage of the shift registers 232 receives the starting signal STV, the first low frequency clock signal LC1, a second low frequency clock signal LC2, a direct-current low voltage VSS and one high frequency clock signal in high frequency clock signals CK1-CK4 through the signal lines 262.

In the present embodiment, each shift register 23 can includes a GOA circuit. The first control signal can be anyone of the high frequency clock signal CK1, the high frequency clock signal CK2, the high frequency clock signal CK3 and the high frequency clock signal CK4.

Wherein, each shift register 23 is inputted with a second control signal, the second control signal can be anyone of the high frequency clock signal CK1, the high frequency clock signal CK2, the high frequency clock signal CK3 and the high frequency clock signal CK4. The shift register 23 generates a scanning signal according to the second control signal. Wherein, a phase of the first control signal is opposite to a phase of the second control signal. For example, when the second control signal connected with the odd-numbered stage of the shift register 231 is the high frequency clock signal CK1, the first control signal connected with the first switching unit 241 corresponding to the odd-numbered stage of the shift register 231 is the high frequency clock signal CK3. Or, when the second control signal connected with the even-numbered stage of the shift register 232 is the high frequency clock signal CK2, the first control signal connected with the second switching unit 242 corresponding to the even-numbered stage of the shift register 232 is the high frequency clock signal CK4.

Figure 3:
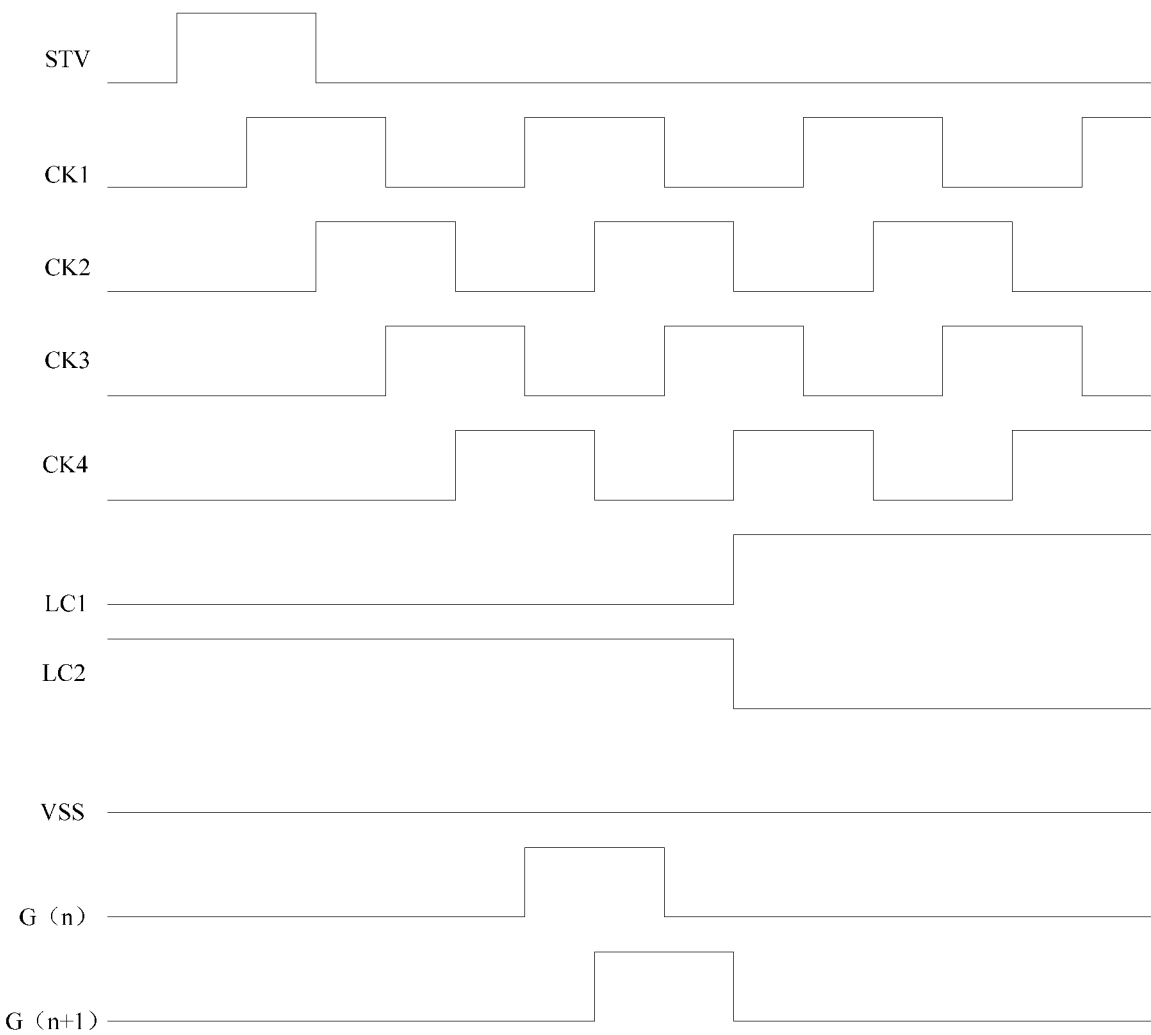
FIG. 3 is a timing diagram of signals in FIG. 2.

As shown in FIG. 3, FIG. 3 is a timing diagram of the first low frequency clock signal LC1, the second low frequency clock signal LC2, the direct-current low voltage VSS, the high frequency clock signal CK1, the high frequency clock signal CK2, high frequency clock signal CK3, and high frequency clock signal CK4. Besides, G(n) and G(n+1) are timing diagrams of the scanning signals. When the multiple odd-numbered stage of the shift register 231 pulls down the voltage level of the odd-numbered stage of the scanning lines 21 to a low level, the multiple first switching units 241 are used for pulling down the voltage level of the odd-numbered stage of the scanning line 21 to a low level. Specifically, when the second control signal inputted in the odd-numbered shift register 21 is at a low voltage level, the scanning signal outputted from the odd-numbered stage of the shift registers 21 is low such that the odd-numbered stage of the shift registers 231 pull down the voltage level of the odd-numbered stage of the scanning lines 21 to the low level. The first control signal inputted to the control terminal of the first switching unit 241 is high, the first switching unit 241 is operated such that the voltage level of the odd-numbered stage of the scanning lines 21 is pulled down to the direct-current low voltage VSS. Accordingly, the multiple odd-numbered stage of the shift registers 231 and the multiple first switching units 241 simultaneously pull down the voltage level at two terminals of the scanning line 21 to a low voltage level.

When the multiple even-numbered stage of the shift registers 232 pulls down the voltage level of the even-numbered stage of the scanning lines 21 to a low level, the multiple second switching units 242 are used for pulling down the voltage level of the even-numbered stage of the scanning line 21 to a low level. Specifically, when the second control signal inputted in the even-numbered stage of the shift registers 21 is at a low voltage level, the scanning signal outputted from the even-numbered stage of the shift registers 232 is at a low level such that the even-numbered stage of the shift registers 232 pull down the voltage level of the even-numbered stage of the scanning lines 21 to a low voltage level. The first control signal inputted to the control terminal of the second switching unit 242 is at a high level, the second switching unit 242 is operated such that the voltage level of the even-numbered stage of the scanning lines 21 is pulled down to the direct-current low voltage VSS. Accordingly, the multiple even-numbered stage of the shift registers 232 and the multiple second switching units 242 simultaneously pull down the voltage level at two terminals of the even-numbered stage of the scanning lines 21 to a low voltage level.

Wherein, each of the multiple switching units 24 can be a thin-film transistor, the control terminal of the switching unit 24 is a gate electrode of the thin-film transistor, the first terminal of the switching unit 24 is a drain electrode of the thin-film transistor, the second terminal of the switching unit 24 is a source electrode of the thin-film transistor.

Accordingly, when the voltage level of the scanning line 21 of the present embodiment is pulled down to a low level by the shift register 23, the first control signal controls the switching unit 24 to operate normally. At this time, the switching unit 24 pulls down the voltage level of the scanning line 21 to a low level simultaneously in order to ensure that the pixel units 25 are simultaneously turned off at left and right sides of the array substrate 20.

Figure 1:
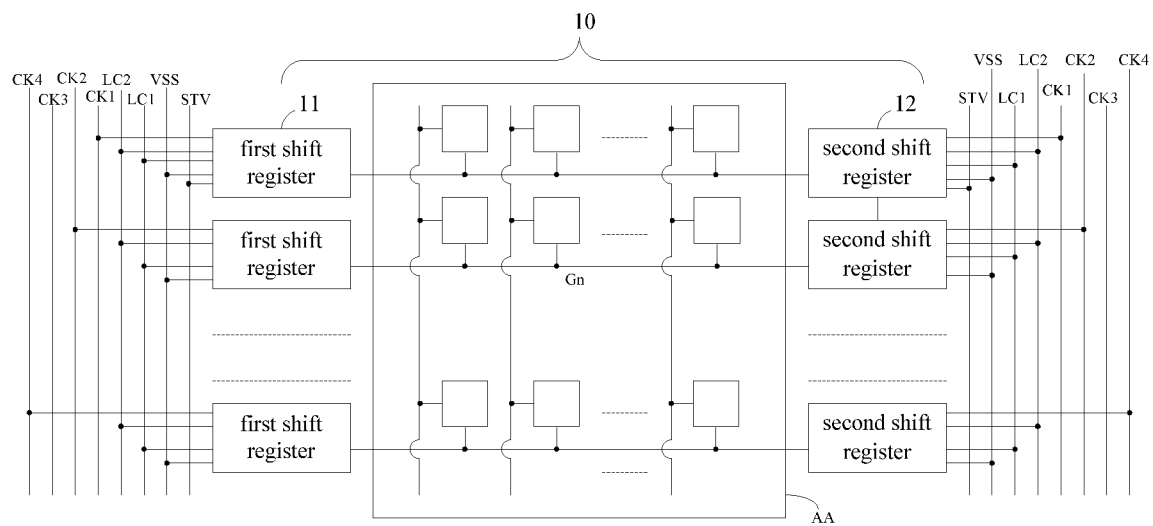
FIG. 1 is a schematic diagram of an array substrate of the conventional art.

With comparing to the multiple shift registers 10 shown in FIG. 1, each scanning line 21 of the present embodiment is corresponding to one shift register so as to reduce the space occupied by the multiple shift registers in order to realize a narrow frame design and increase the user experience. Besides, the shift register and the switching unit simultaneously pull down a voltage level of the scanning line to a low level, which can ensure that the time that the voltage level of the scanning line pulled to the low level is the same.

Furthermore, in another embodiment, the control terminal of the switching unit 24 receives the second control signal, the other terminal of the scanning line 21 is connected with the first terminal of the corresponding switching unit 24, and the second terminal of the switching unit 24 receives a high voltage level. When the second control signal is at a high voltage level, the switching unit 24 and the shift register 23 are operated simultaneously. At this time, the scanning signal outputted by the shift register 23 is at a high level, and the switching unit 24 pulls up the voltage level of the scanning line 21 to a high level such that the pixel units 25 at two sides of the scanning lines 21 are turned on simultaneously.

Figure 4:
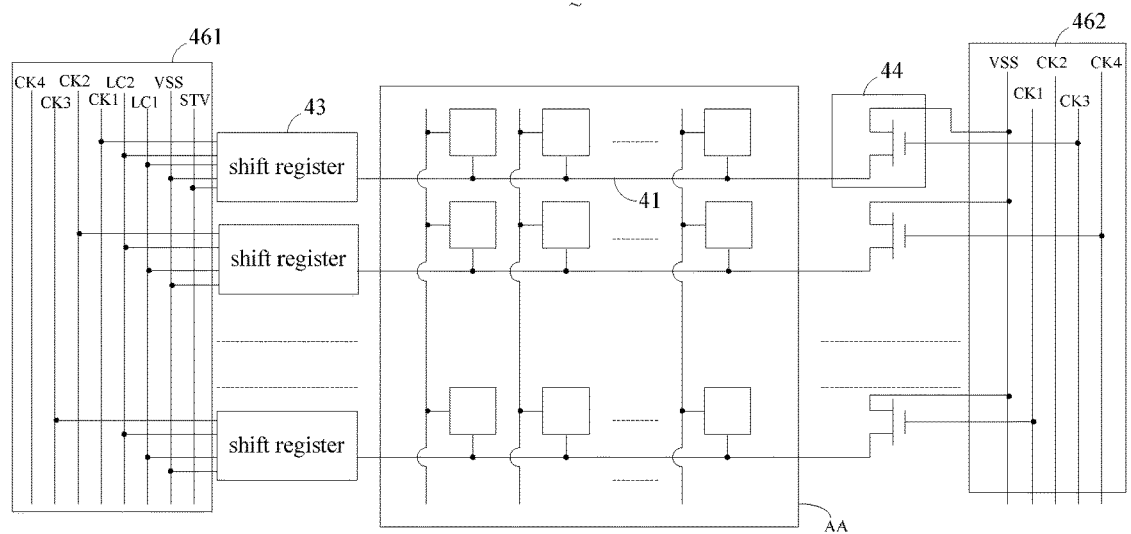
FIG. 4 is a schematic diagram of an array substrate according to a second embodiment.

As shown in FIG. 4, the difference between an array substrate 40 of the second embodiment and the array substrate 20 described in the first embodiment is that the multiple shift registers 43 are disposed at the left side of the display region AA of the array substrate 40, the multiple switching units 44 are disposed at the right side of the display region AA. A side of the multiple shift registers 43 away from the display region AA is provided with signal lines 461, a side of the multiple switching units 44 away from the display region AA is provided with signal lines 462.

Figure 5:
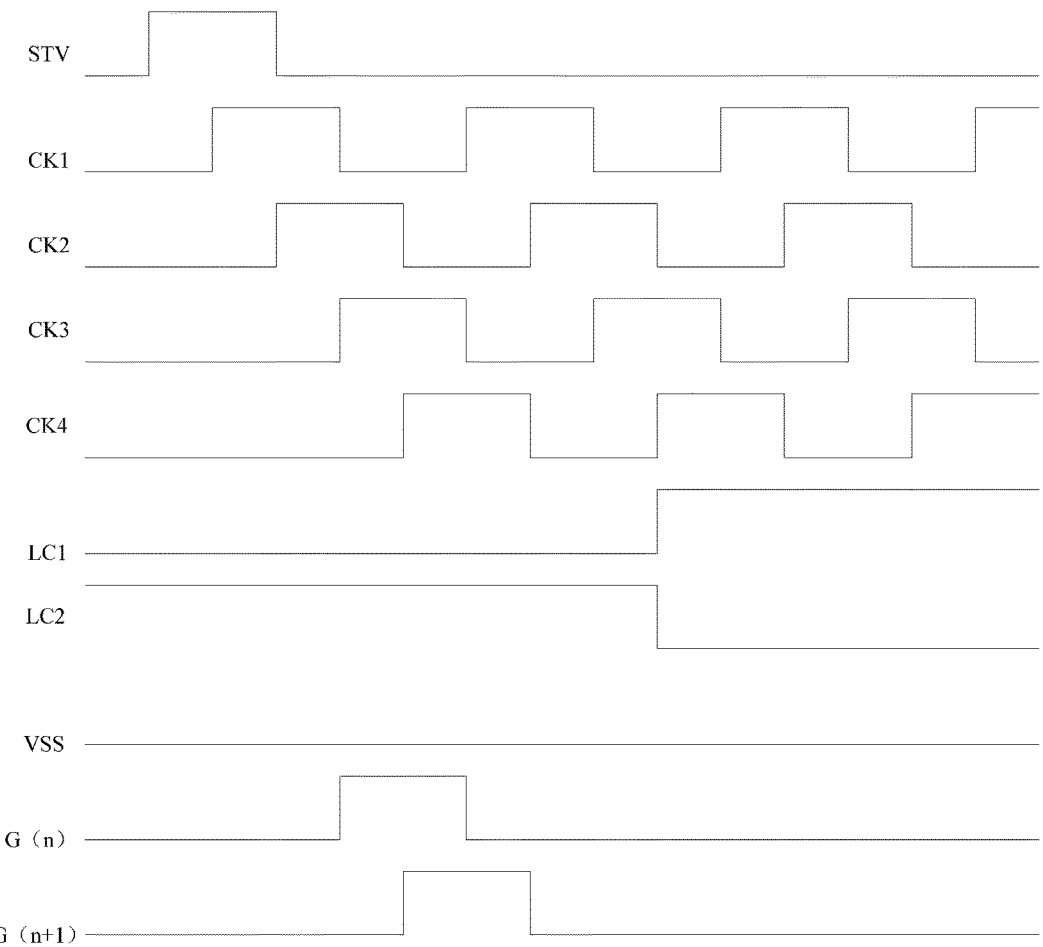
FIG. 5 is a timing diagram of signals in FIG. 4.

Wherein, the signal lines 461 are used for transmitting a starting signal STV, a first low frequency clock signal LC1, a second low frequency clock signal LC2, a direct-current low voltage VSS and one high frequency clock signal in the high frequency clock signals CK1-CK4. The signal lines 462 are used for transmitting a direct-current low voltage VSS, one high frequency clock in high frequency signals CK1-CK4. The timing diagram corresponding to the shift registers 43 in the present embodiment is shown in FIG. 5.

With comparing to the multiple shift registers 10 shown in FIG. 1, each scanning line 41 of the present embodiment is corresponding to one shift register, and the multiple shift registers 43 are disposed at a left side of the display region AA of the array substrate 40 in order to reduce the space occupied by the multiple shift registers 43 to realize a narrow frame design and increase the user experience. Besides, the shift register and the switching unit simultaneously pull down a voltage level of the scanning line to a low level, which can ensure that the time that the voltage level of the scanning line pulled to the low level is the same.

In another embodiment, person skilled in the art can fully dispose the multiple shift registers at the right side of the display region of the array substrate, and dispose the multiple switching units at the right side of the display region.

Figure 6:
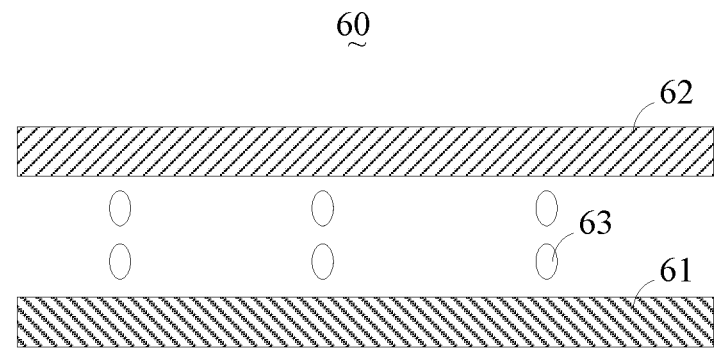
FIG. 6 is a schematic diagram of a display panel of according to a first embodiment.

As shown in FIG. 6, the display panel 60 of the present embodiment includes an array substrate 61, a color filter substrate 62 and a liquid crystal layer 63. The color filter substrate 62 is disposed oppositely to the array substrate 61, the liquid crystal layer 63 is disposed between the color filter substrate 62 and the array substrate 61. The array substrate 61 is the array substrate illustrated in the above embodiments, no more repeating.

Figure 7:
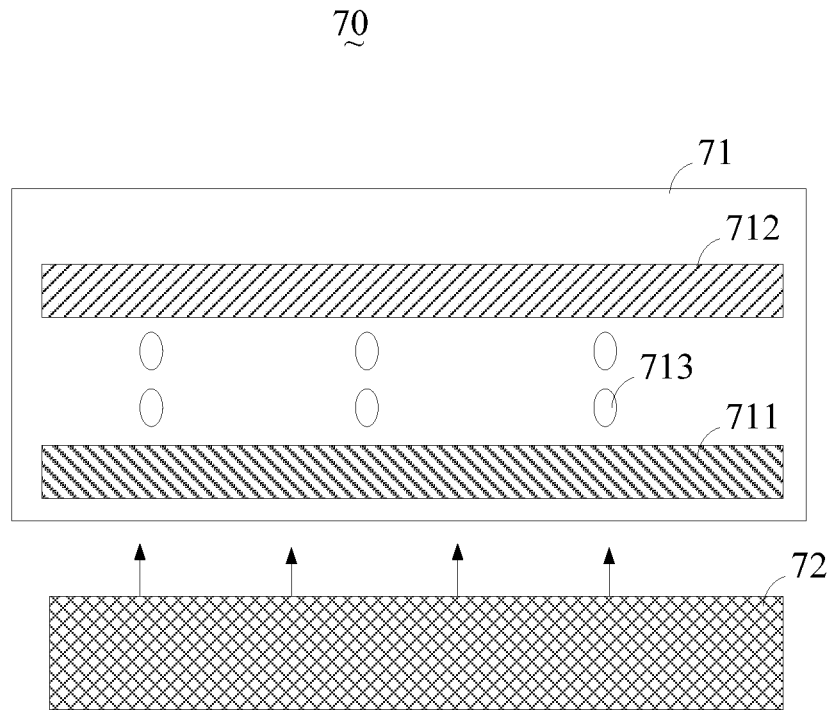
FIG. 7 is a schematic diagram of a display device of according to a first embodiment.

As shown in FIG. 7, the display device 70 of the present embodiment includes a display panel 71 and a backlight module 72. The display panel 71 is disposed at a light-emitting direction of the backlight module 72. The display panel 71 includes an array substrate 711, a color filter substrate 712 and a liquid crystal layer 713. The color filter substrate 712 is disposed opposite to the array substrate 711. The liquid crystal layer 713 is disposed between the color filter substrate 712 and the array substrate 711. The array substrate 711 is the array substrate illustrated in the above embodiments, no more repeating.

In summary, each shift register of the present invention is used for inputting a scanning signal to one terminal of a corresponding scanning line, the other terminal of each scanning line is connected with a first terminal of the switching unit, a second terminal of the switching unit receives a first reference voltage, a control terminal of the switching unit receives a first control signal and the shift register and the switching unit simultaneously pull down a voltage level of the scanning line to a low level. Wherein, each scanning line is corresponding to one shift register so as to reduce the space occupied by the multiple shift registers in order to realize a narrow frame design and increase the user experience. Besides, the shift register and the switching unit simultaneously pull down a voltage level of the scanning line to a low level, which can ensure that the time that the voltage level of the scanning line pulled to the low level is the same.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A display panel, wherein the display panel includes an array substrate, and the array substrate comprises multiple scanning lines, multiple data lines, multiple shift registers and multiple switching units; wherein the multiple scanning lines and the multiple data lines are intersected in order to form multiple pixel units; wherein each shift register is used for inputting a scanning signal to one terminal of a corresponding scanning line, the other terminal of each scanning line is connected with a first terminal of the switching unit, a second terminal of the switching unit receives a first reference voltage, a control terminal of the switching unit receives a first control signal; and wherein the shift register and the switching unit simultaneously pull down a voltage level of the scanning line to a low level;

wherein the multiple shift registers includes multiple odd-numbered stage of the shift registers and multiple even-numbered stage of the shift registers, the multiple odd-numbered stage of the shift registers are disposed at a left side of a display region of the array substrate, the multiple even-numbered stage of the shift registers are disposed at a right side of the display region of the array substrate, the multiple odd-numbered stage of the shift registers are respectively connected with terminals of odd-numbered stage of the scanning lines, and the multiple even-numbered stage of the shift registers are respectively connected with terminals of even-numbered stage of the scanning lines;

wherein the multiple switching units include multiple first switching units and multiple second switching units, the multiple first switching units are disposed at the right side of the display region, and the multiple second switching units are disposed at the left side of the display region; wherein the multiple first switching units are respectively connected with the other terminals of the odd-numbered stage of the scanning lines, and the multiple second switching units are respectively connected with the other terminals of the even-numbered stage of the scanning lines;

wherein the multiple shift registers are disposed at the left side of the display region of the array substrate, the multiple switching units are disposed at the right side of the display region; and wherein each shift register is inputted with a second control signal, each shift register generates the scanning signal according to the second control signal, a phase of the first control signal is opposite to a phase of the second control signal.

2. The display panel according to claim 1, wherein when the multiple odd-numbered stage of the shift register pulls down the voltage level of the odd-numbered stage of the scanning lines to a low level, the multiple first switching units are used for pulling down the voltage level of the odd-numbered stage of the scanning line to a low level; and wherein when the multiple even-numbered stage of the shift registers pulls down the voltage level of the even-numbered stage of the scanning lines to a low level, the multiple second switching units are used for pulling down the voltage level of the even-numbered stage of the scanning line to a low level.

3. The display panel according to claim 1, wherein each of the multiple switching units is a thin-film transistor, the control terminal of the switching unit is a gate electrode of the thin-film transistor, the first terminal of the switching unit is a drain electrode of the thin-film transistor, the second terminal of the switching unit is a source electrode of the thin-film transistor.

4. An array substrate, comprising:
multiple scanning lines;
multiple data lines;
multiple shift registers; and
multiple switching units;
wherein the multiple scanning lines and the multiple data lines are intersected in order to form multiple pixel units;
wherein each shift register is used for inputting a scanning signal to one terminal of a corresponding scanning line, the other terminal of each scanning line is connected with a first terminal of the switching unit, a second terminal of the switching unit receives a first reference voltage, a control terminal of the switching unit receives a first control signal;
wherein the shift register and the switching unit simultaneously pull down a voltage level of the scanning line to a low level; and
wherein each shift register is inputted with a second control signal, each shift register generates the scanning signal according to the second control signal, a phase of the first control signal is opposite to a phase of the second control signal.

5. The array substrate according to claim 4, wherein the multiple shift registers includes multiple odd-numbered stage of the shift registers and multiple even-numbered stage of the shift registers, the multiple odd-numbered stage of the shift registers are disposed at a left side of a display region of the array substrate, the multiple even-numbered stage of the shift registers are disposed at a right side of the display region of the array substrate, the multiple odd-numbered stage of the shift registers are respectively connected with terminals of odd-numbered stage of the scanning lines, and the multiple even-numbered stage of the shift registers are respectively connected with terminals of even-numbered stage of the scanning lines.

6. The array substrate according to claim 5, wherein the multiple switching units include multiple first switching units and multiple second switching units, the multiple first switching units are disposed at the right side of the display region, and the multiple second switching units are disposed at the left side of the display region; wherein the multiple first switching units are respectively connected with the other terminals of the odd-numbered stage of the scanning lines, and the multiple second switching units are respectively connected with the other terminals of the even-numbered stage of the scanning lines.

7. The array substrate according to claim 6, wherein when the multiple odd-numbered stage of the shift register pulls down the voltage level of the odd-numbered stage of the scanning lines to a low level, the multiple first switching units are used for pulling down the voltage level of the odd-numbered stage of the scanning line to a low level; and wherein when the multiple even-numbered stage of the shift registers pulls down the voltage level of the even-numbered stage of the scanning lines to a low level, the multiple second switching units are used for pulling down the voltage level of the even-numbered stage of the scanning line to a low level.

8. The array substrate according to claim 4, wherein the multiple shift registers are disposed at the left side of the display region of the array substrate, the multiple switching units are disposed at the right side of the display region.

9. The array substrate according to claim 4, wherein the multiple shift registers are disposed at the right side of the display region of the array substrate, the multiple switching units are disposed at the left side of the display region.

10. The array substrate according to claim 4, wherein each of the multiple switching units is a thin-film transistor, the control terminal of the switching unit is a gate electrode of the thin-film transistor, the first terminal of the switching unit is a drain electrode of the thin-film transistor, the second terminal of the switching unit is a source electrode of the thin-film transistor.

11. A display device, wherein the display device includes an array substrate, and the array substrate comprises:
multiple scanning lines;
multiple data lines;
multiple shift registers; and
multiple switching units;
wherein the multiple scanning lines and the multiple data lines are intersected in order to form multiple pixel units;
wherein each shift register is used for inputting a scanning signal to one terminal of a corresponding scanning line, the other terminal of each scanning line is connected with a first terminal of the switching unit, a second terminal of the switching unit receives a first reference voltage, a control terminal of the switching unit receives a first control signal;
wherein the shift register and the switching unit simultaneously pull down a voltage level of the scanning line to a low level; and
wherein each shift register is inputted with a second control signal, each shift register generates the scanning signal according to the second control signal, a phase of the first control signal is opposite to a phase of the second control signal.

12. The display device according to claim 11, wherein the multiple shift registers includes multiple odd-numbered stage of the shift registers and multiple even-numbered stage of the shift registers, the multiple odd-numbered stage of the shift registers are disposed at a left side of a display region of the array substrate, the multiple even-numbered stage of the shift registers are disposed at a right side of the display region of the array substrate, the multiple odd-numbered stage of the shift registers are respectively connected with terminals of odd-numbered stage of the scanning lines, and the multiple even-numbered stage of the shift registers are respectively connected with terminals of even-numbered stage of the scanning lines.

13. The display device according to claim 12, wherein the multiple switching units include multiple first switching units and multiple second switching units, the multiple first switching units are disposed at the right side of the display region, and the multiple second switching units are disposed at the left side of the display region; wherein the multiple first switching units are respectively connected with the other terminals of the odd-numbered stage of the scanning lines, and the multiple second switching units are respectively connected with the other terminals of the even-numbered stage of the scanning lines.

14. The display device according to claim 13, wherein when the multiple odd-numbered stage of the shift register pulls down the voltage level of the odd-numbered stage of the scanning lines to a low level, the multiple first switching units are used for pulling down the voltage level of the odd-numbered stage of the scanning line to a low level; and wherein when the multiple even-numbered stage of the shift registers pulls down the voltage level of the even-numbered stage of the scanning lines to a low level, the multiple second switching units are used for pulling down the voltage level of the even-numbered stage of the scanning line to a low level.

15. The display device according to claim 11, wherein the multiple shift registers are disposed at the left side of the display region of the array substrate, the multiple switching units are disposed at the right side of the display region.

16. The display device according to claim 11, wherein the multiple shift registers are disposed at the right side of the display region of the array substrate, the multiple switching units are disposed at the left side of the display region.

17. The display device according to claim 11, wherein each of the multiple switching units is a thin-film transistor, the control terminal of the switching unit is a gate electrode of the thin-film transistor, the first terminal of the switching unit is a drain electrode of the thin-film transistor, the second terminal of the switching unit is a source electrode of the thin-film transistor.

* * * * *